(12) United States Patent
Cheng et al.

(10) Patent No.: US 9,069,256 B2
(45) Date of Patent: *Jun. 30, 2015

(54) METHOD OF OPTICAL FABRICATION OF THREE-DIMENSIONAL POLYMERIC STRUCTURES WITH OUT OF PLANE PROFILE CONTROL

(75) Inventors: Chao-Min Cheng, New Taipei (TW); Bin Li, Suzhou (CN); Philip Ray LeDuc, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 174 days.

This patent is subject to a terminal disclaimer.

(21) Appl. No.: 13/469,364

(22) Filed: May 11, 2012

(65) Prior Publication Data

US 2012/0264065 A1    Oct. 18, 2012

Related U.S. Application Data

(63) Continuation of application No. 12/083,135, filed as application No. PCT/US2006/038468 on Oct. 3, 2006, now Pat. No. 8,192,922.

(60) Provisional application No. 60/723,082, filed on Oct. 3, 2005.

(51) Int. Cl.
  *G03F 7/20* (2006.01)
  *G03F 7/38* (2006.01)

(52) U.S. Cl.
  CPC ...... *G03F 7/38* (2013.01); *G03F 7/201* (2013.01); *G03F 7/2051* (2013.01); *G03F 7/70416* (2013.01)

(58) Field of Classification Search
  CPC ....... G03F 7/2051; G03F 7/2053; G03F 7/38; G03F 7/70383; G03F 7/201

USPC ................... 430/322, 325, 327, 330
See application file for complete search history.

(56) References Cited

U.S. PATENT DOCUMENTS

| | | |
|---|---|---|
| 5,998,096 A | 12/1999 | Umemoto et al. |
| 2004/0067431 A1 | 4/2004 | Arney et al. |
| 2004/0126694 A1 * | 7/2004 | Devoe et al. ............... 430/270.1 |
| 2007/0282030 A1 * | 12/2007 | Anderson et al. .............. 522/1 |

FOREIGN PATENT DOCUMENTS

| | | |
|---|---|---|
| EP | 1308785 A | 7/2003 |
| JP | 2004280017 A | 10/2004 |
| WO | WO 01/22133 A1 * | 3/2001 |

OTHER PUBLICATIONS

Cheng et al., "Optical Fabrication of Three-Dimensional Polymeric Microstructures", Applied Physics Letters 87, 1 (2005).*
Computer-generated translation of JP 2004-280017; 2004.
Ikuta, Koji, Hirowatari, Ken; Real Three Dimensional Micro Fabrication Using Stereo Lithography and Metal Molding; IEEE, Proceedings of the Workshop No. 6 on MEMS; Fort Lauderdale, FL; pp. 42-47; 1993.
Pitchumani, Mahesh, Mohammed, Waleed, Hockel, Heidi, Johnson, Eric; Presculpting of Photoresists Using Additive Lithography; Proceedings of the SPIE, 5347(1); pp. 85-94; 2004.
Salmoria, G., Ahrens, C., Fredel, M., Solidi, V., Pires, A.; Stereolithography Somos 7110 Resin: Mechanical Behavior and Fractography of Parts Post-Cured by Different Methods; Polymer Testing, 24(2); pp. 157-162; 2005.

* cited by examiner

*Primary Examiner* — John A McPherson
(74) *Attorney, Agent, or Firm* — Jones Day

(57) ABSTRACT

A method of optical fabrication comprises coating a substrate with a photocuring material, controlling the application of light to the photocuring material so as to control the intensity and pattern of the light both in-plane and out of plane, and developing the photocuring material.

21 Claims, 7 Drawing Sheets

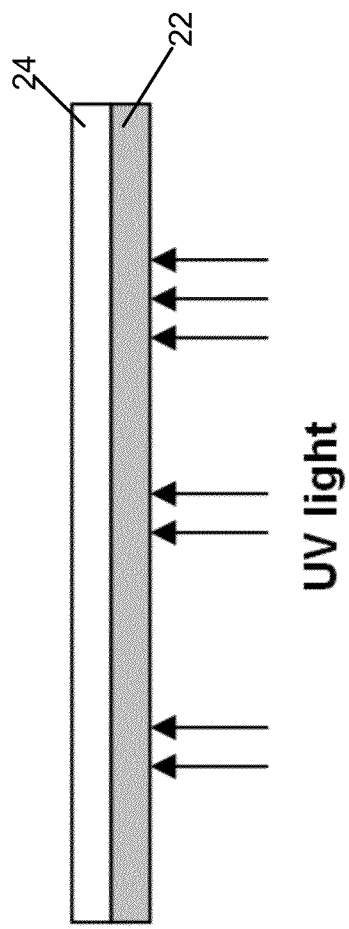
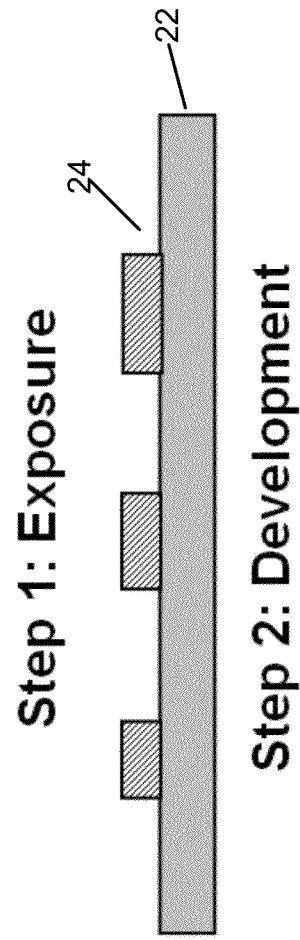
Fig. 2A
Fig. 2B

METHOD OF OPTICAL FABRICATION OF THREE-DIMENSIONAL POLYMERIC STRUCTURES WITH OUT OF PLANE PROFILE CONTROL

This application is a continuation of U.S. application Ser. No. 12/083,135, filed 14 Oct. 2008 and entitled Method Of Optical Fabrication Of Three-Dimensional Polymeric Structures With Out Of Plane Profile Control, the entirety of which is hereby incorporated by reference. This application claims the benefit of U.S. application Ser. No. 60/723,082, filed 3 Oct. 2005 and entitled Optical Fabrication Of Three-Dimensional Polymeric Microstructures, the entirety of which is hereby incorporated by reference. This application also claims the benefit of PCT application serial no. PCT/US2006/038468, filed 3 Oct. 2006 and entitled Method Of Optical Fabrication Of Three-Dimensional Polymeric Structures With Out Of Plane Profile Control, the entirety of which is hereby incorporated by reference.

BACKGROUND

The present invention is related to maskless fabrication techniques and, more particularly, to techniques that rely on optical curing of a polymeric material.

Physics based techniques have created a revolution in the computer chip industry and have been further developed in sophisticated applications using silicon and glass for building traditional integrated circuits (IC) through processes including photolithography, etching techniques, and deposition. These processes often have limitations including fabrication cost, clean-room conditions, labor intensive processes, and material technologies. Thus, alternate technologies have evolved including soft lithography, nanoimprint lithography, microcontact printing, and capillary lithography. One of the common features of many of these techniques is that they utilize a mold of either silicon or polymer, which is brought into contact with an underlying mask containing the essential fabricated features. These systems require access to specific equipment and also significant fabrication time for each component. The original process of hard lithography has been augmented with the advent of soft lithography, which allowed a master mold to be developed and then used to produce many copies with polydimethylsiloxane or other polymers.

One example of a maskless optical fabrication system is disclosed in U.S. Pat. No. 6,841,340 to Tani. Tani discloses a highly accurate structure optically fabricated simply and in a short time. Rough optical fabrication using an ultraviolet-irradiation optical fabrication process is carried out for a photo-curing resin by emission of a laser beam from a first light source, and thereafter, fine optical fabrication using a two-photon absorption optical fabrication process is carried out by emission of a laser beam from a second light source. As a result, it is possible to realize optical fabrication which allows fabrication of a fine structure using a two-photon absorption optical fabrication process while realizing high speed processing using the ultraviolet-irradiation optical fabrication process.

Another example of a maskless optical fabrication system is disclosed in U.S. Pat. No. 6,410,213 to Raguin et al. Disclosed therein is a system for the fabrication of arbitrary profile micro-optical structures (lenses, gratings, etc.) and, if desired, with optomechanical alignment marks simultaneously during fabrication, upon the use of low-contrast photosensitive material that, when exposed to a spatially variable energy dosage of electromagnetic radiation, can be processed to achieve multi-level or continuous surface-relief microstructures. By varying the exposure dose spatially based upon predetermined contrast curves of the photosensitive material, arbitrary one-dimensional (1-D) or two-dimensional (2-D) surface contours, including spherical, aspherical, toroidal, hyperbolic, parabolic, and ellipsoidal, can be achieved with surface sags greater than 15 µm. Surface profiles with advanced phase correction terms (e.g., Zernike polynomials) can be added to increase the alignment tolerance and overall system performance of the fabricated structure can also be fabricated. The continuous-relief pattern can be used as is in the photosensitive material, transferred into the underlying substrate through an etch process, electroformed into a metal, or replicated into a polymer.

SUMMARY

A technique is disclosed for building three-dimensional structures using optical methods combined with photocuring chemistry. This method merges an optics based approach with chemical restructuring through the transition of materials from distinct phases. By activating this photocurable material in combination with controlling the intensity distributions that are inherently in optical patterns, in-situ fabrication of three-dimensional polymeric microstructures is achieved. This simple approach combined with thermal control can create complex shapes including curved and asymmetric profiles.

According to one embodiment, a method of optical fabrication comprises coating a substrate with a photocuring material; controlling the application of light to the photocuring material so as to control the intensity and pattern of the light both in-plane (e.g. X and Y) and out of plane (e.g. Z); and developing the photocuring material. Other embodiments include controlling the application of the light with one or more lenses, by combing one or more light beams, or some combination of lenses and light beams. Developing the photocuring material may involve controlling the time and or temperature. According to another embodiment, the structure may be heated to use thermal reflow to help shape the device.

This method has potential applications in a variety of fields including optical techniques, photoactivatable materials, and lab-on-a-chip systems. Those, and other advantages and benefits will be apparent from the description below.

BRIEF DESCRIPTION OF THE FIGURES

For the present invention to be easily understood and readily practiced, the present invention will now be described, for purposes of illustration and not limitation, in conjunction with the following figures wherein:

FIGS. 2A and 2B illustrate a maskless fabrication process.

FIG. 4C is an SEM image of a three-dimensional structure fabricated through controlling the horizontal and vertical scanning focus position. The curved surface is observed by the profilometer measurements in FIG. 4D.

FIGS. 5B and 5E—10 secs; and FIGS. 5C and 5F—60 secs.

FIG. 6A illustrates a beam of light, while FIGS. 6B and 6C illustrate the in-plane and out of plane profiles, respectively, of the beam of light in FIG. 6A.

FIG. 7 is a block diagram illustrating the process flow of the disclosed method.

DESCRIPTION OF A PREFERRED EMBODIMENT

Figure 1:
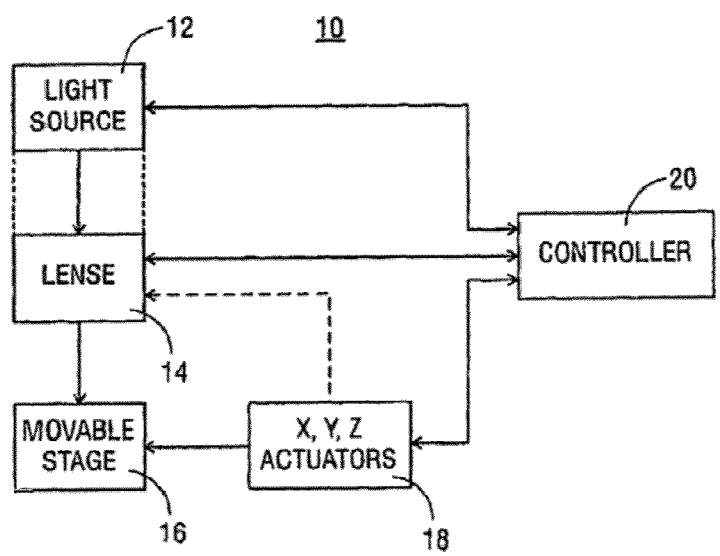
FIG. 1 is a block diagram of a system according to the teachings of the present invention.

In this document, we introduce a novel process for creating three-dimensional structures that can be practiced on a variety of devices, depicted generally in FIG. 1. In FIG. 1, the system 10 is comprised of a light source 12, a lens 14, and a movable stage 16. The stage 16 and/or the lens 14 can be moved via X, Y, and Z actuators 18. The position of the stage 16 and/or the lens 14, the intensity and optionally the wavelength of the light source 12, and the focus of the lens 14 are controlled by a controller 20 executing software instructions for carrying out the process.

One example of the system 10 depicted in FIG. 1 utilizes an inverted microscope (not shown) with either epi-fluorescence or laser confocal capabilities. The source of excitation is used to activate the photocurable material, inducing a shift to a stable solid state. Using this technique and dictating the excitation profile through controlling the X, Y, and Z distributions with the actuation of the microscope stage and objective, we build three-dimensional microstructures with various configurations on the same substrate. Patterns, intensities and the like in the X, Y directions may be referred to as in-plane while patterns, intensities and the like in the Z direction may be referred to as out of plan.

This maskless fabrication process creates easily controlled profiles by implementing the optical principles of spatial signal distribution. Intensities along the X, Y, and Z axes are not step functions, but rather have a distribution across all of the spatial dimensions even while focusing with optical objectives. Our technique also utilizes the feature of thermal distributions in the horizontal and vertical configurations as this allows additional control over creating asymmetric profiles during the photocuring process.

SU-8 is used as the photocurable material for fabricating polymeric microstructures using these optical techniques. SU-8 is a negative, epoxy-type, near-UV photoresist based on EPON SU8 resin (Shell Chemical). We prepare the material by dissolving an EPON resin SU8 in an organic solvent gamma-butyrolacton (GBL) with the amount of the solvent determining the viscosity and the range of potential thicknesses of the film. The material in our studies consists of GBL (59% wt.) and solids (41% wt.). After spinning the liquid SU-8 resin on the substrate, we heat the system on a hotplate at 75° C. for 30 minutes (softbake). We then utilize a microscope to expose the SU-8 to UV excitation with either a laser confocal microscope (Olympus Fluoview 1000) or an epifluorescence microscope (Zeiss Axiovert) with the light source spectrum between 365 nm and 410 nm. We then develop the system in propylene glycol methyl ether acetone (PGMEA) and rinse in water followed by air drying. We use a maskless process to fabricate these three-dimensional systems, which involve locally activating the photocurable material.

FIGS. 2A and 2B are schematics of the disclosed maskless fabrication process. A glass substrate 22 is coated with photocurable SU-8 resin 24 and is excited in localized areas by either a scanning laser confocal microscope, an epifluorescence inverted microscope, or other appropriate light source. The spectrum of the light source is between 365 nm and 410 nm. The substrates are then developed with propylene glycol methyl ether acetone to create the final structures.

To control the creation of the two- and three-dimensional structures in our process, the distribution of the excitation must be understood. We predict the wall profile of the polymeric microstructure based on the intensity of the signals to which the material would be exposed. The attenuation of intensity in the SU-8 in the vertical direction (which is controlled by the focal plane of the microscope objective) can be approximated by a power function with respect to depth. The attenuation function of near UV-light intensity in SU-8, B(r), is represented by:

$$B(r)=1-C \times r^D \quad (1)$$

where r is the depth in the SU-8 in micrometers. The constants C and D in Eq. (1) are 0.066 and 0.403, respectively.

Figure 3:
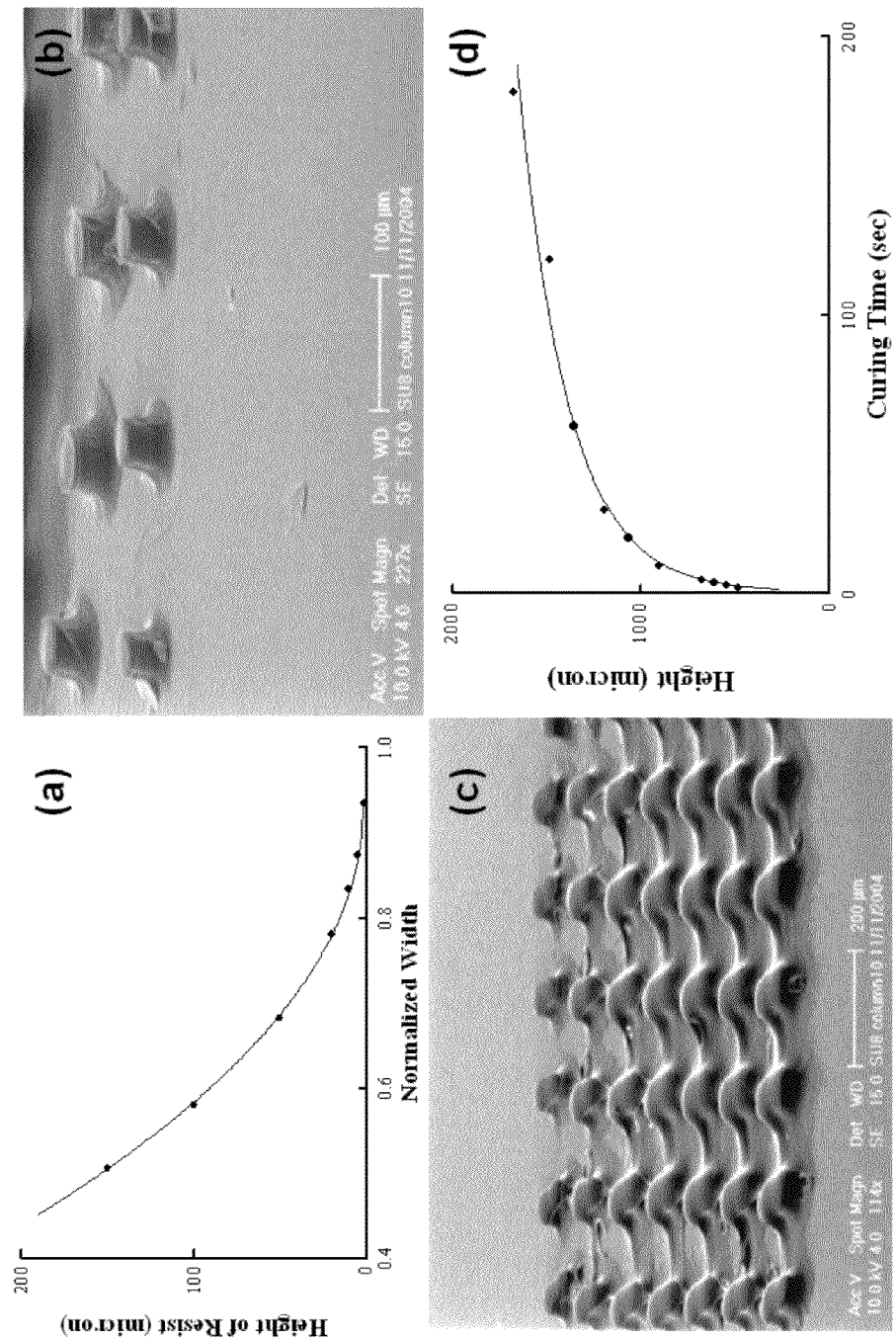
FIG. 3A illustrates wall profiles of the structures based on theoretical modeling of the SU-8 material comparing the normalized width to the height of the systems.
FIG. 3B is a scanning electron microscope (SEM) image of fabricated structures.
FIG. 3C illustrates a plurality of SU-8 microstructures fabricated using the curing process with a mask for a point of comparison (light source: inverted epifluorescence microscope).
FIG. 3D illustrates the relationship between curing time and the height of SU-8 microstructures.

Furthermore, a contour of the normalized constant intensity in the SU-8 can be obtained through:

$$\frac{I_F(x, r)B(r)}{kI_{inc}} = B(r = D) \quad (2)$$

where k is the inverse product of exposure dosage and exposure sensitivity, $I_F(x)$ is the intensity distribution pattern and $I_{inc}$ is the intensity of incident UV-light. With a given material, selecting the proper exposure time yields a corresponding parameter k. FIG. 3A is the SU-8 wall profile predicted by Eq. (2). Based on the theoretical solution, the width at the top of the SU-8 would be smaller than at the base (closer to the surface), which is confirmed by a scanning electron microscope (SEM) image in FIG. 3B. We use conventional mask lithography (for comparison) with UV light activation, which reveals repeatable, yet undulating patterns (see FIG. 3C). This pattern suggests that a thermal effect generates a reflow of the photocurable material, which could be used in the creation of applications such as a functional biomimetic microlens arrays. In addition, controlling the curing times of these systems can be leveraged to define the heights of the individual features. (see FIG. 3D) The thermal reflow effect in this process though can be reduced through using a laser with low power but high energy density to cure the SU-8 material. The thermal reflow may be implemented, before, after, or during the developing step, or some combination thereof.

Figure 4:
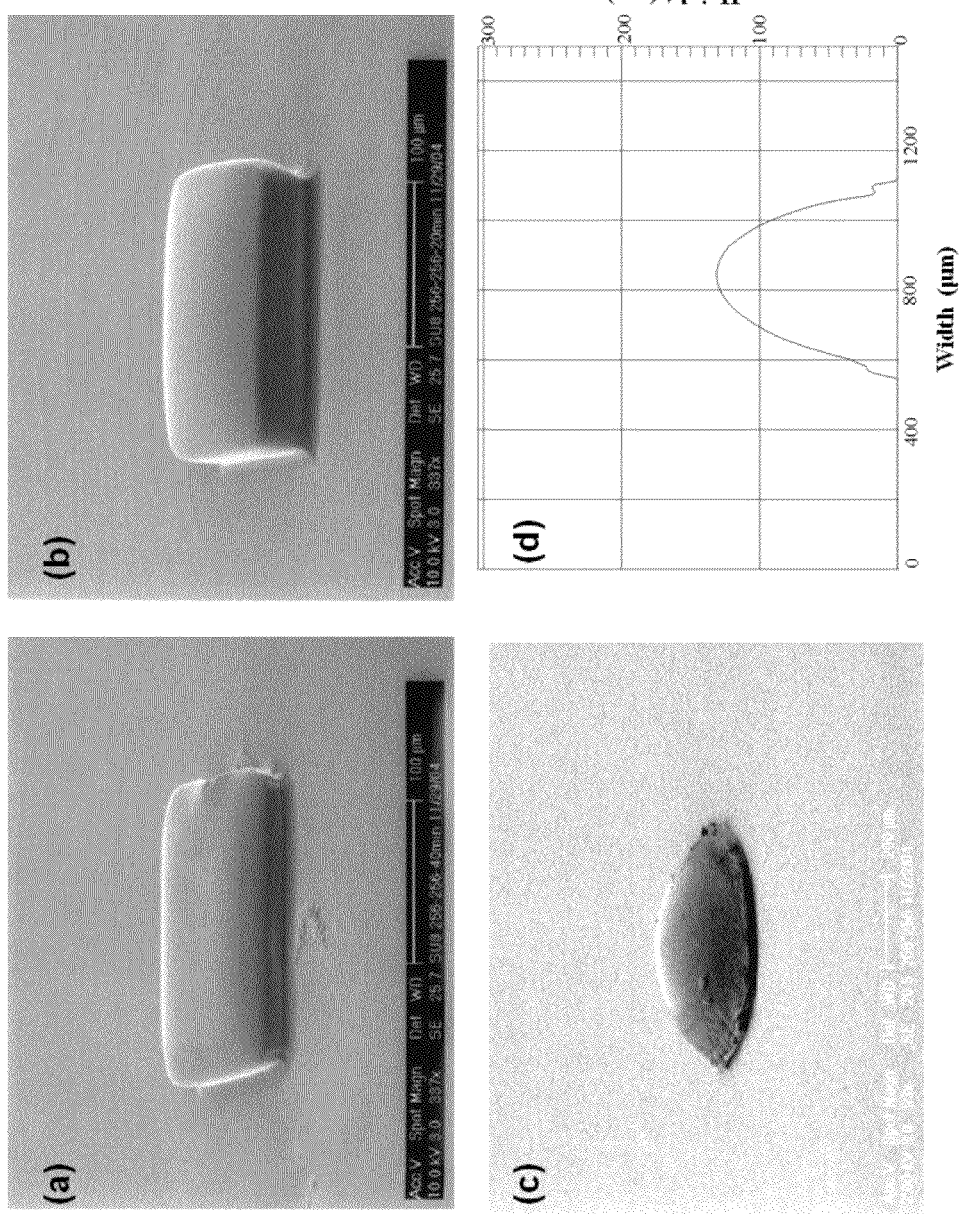
FIG. 4 is a profile control of SU-8 microstructures built using the maskless curing process (light source: laser from a confocal microscope). Faster curing times control the uniformity of a three-dimensional scanned system for SEM images of a FIG. 4A small and FIG. 4B large vertical actuation of the laser source in the confocal microscope.

FIGS. 4A and 4B exhibit the polymeric microstructures that are built using the laser of a confocal microscope. Depending on the exposure time, these structures have constant edges yet are different in height through vertical scanning of the laser. A three-dimensional microstructure with a curved surface similar to the surface of an optical lens is fabricated when controlling the focus of the laser (FIG. 4C) in all three axes; this is quantitatively determined using a profilometer (FIG. 4D). Increasing the curing times allows us to obtain taller structures in the vertical direction with the tightest tolerance on the curing time occurring below approximately 40 seconds.

Figure 5:
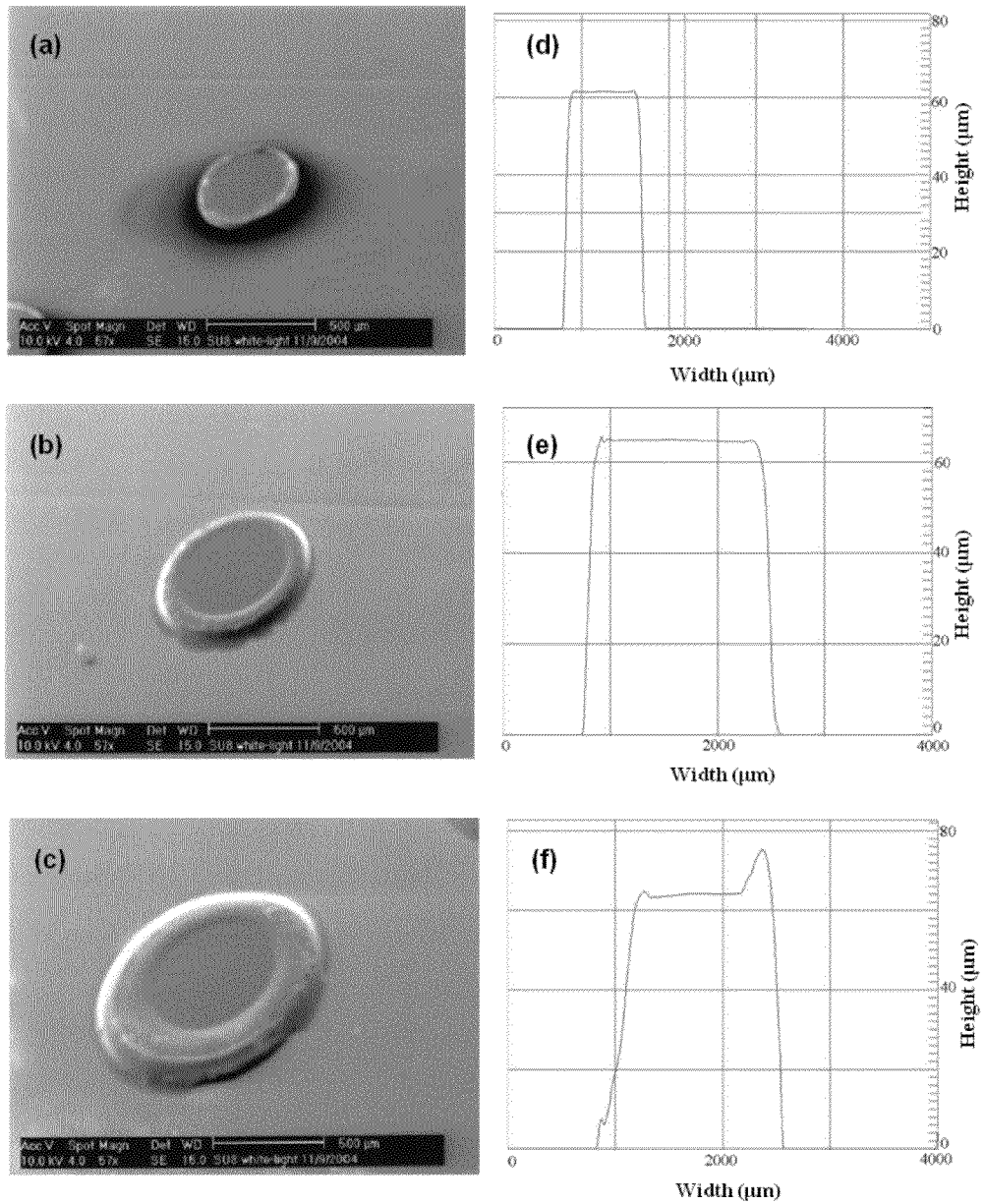
FIG. 5 illustrates the control of thermal reflow with the maskless process to form donut shaped rings. SEM images and profilometer measurements for curing times of FIGS. 5A and 5D—1 sec.

The thermal effect in the maskless curing process allows another degree of control in three-dimensions. The curing time affects the outer ring when curing this surface based SU-8. With an increase in the curing time, the outer ring is enlarged. At less than 10 seconds, the polymerization of SU-8 occurs with a relatively uniform distribution (FIGS. 5A and 5D). At longer times for heating, the thermal effect induced from the UV source allows the temperature in the center of this profile to become higher than at the outer edge, which results in the reflow and spreading of the SU-8 (FIGS. 5B and 5E). At greater than 60 seconds, the outer ring becomes the dominant feature across the width (FIGS. 5C and 5F).

Figure 6:
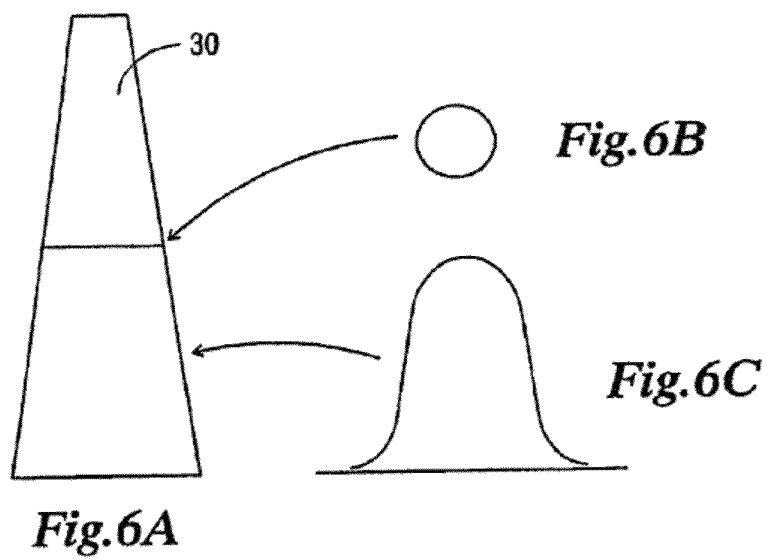

Turning now to FIG. 6A, FIG. 6A illustrates a beam of light 30 that may be used to activate the photocurable material. The intensity and the wavelength of the beam 30 may be controlled by sending appropriate control signals from the controller 20 to the light source 12 of FIG. 1. The in-plane profile (shape) of the beam of light is shown in FIG. 6B while the out of plane profile (shape) of the beam of light is shown in FIG. 6C. By controlling the out of plane profile, the profile (shape) of the walls of the structure being fabricated can be controlled. The out of plane profile of the beam of light can be controlled by controlling the lens 14 of FIG. 1. Another way to control the out of plane profile is to use more than one light beam, and to have those beams interfere positively (so as to add to one another) or negatively (so as to subtract from one another). Some combination of multiple beams and multiple lenses may also be used.

Figure 7:
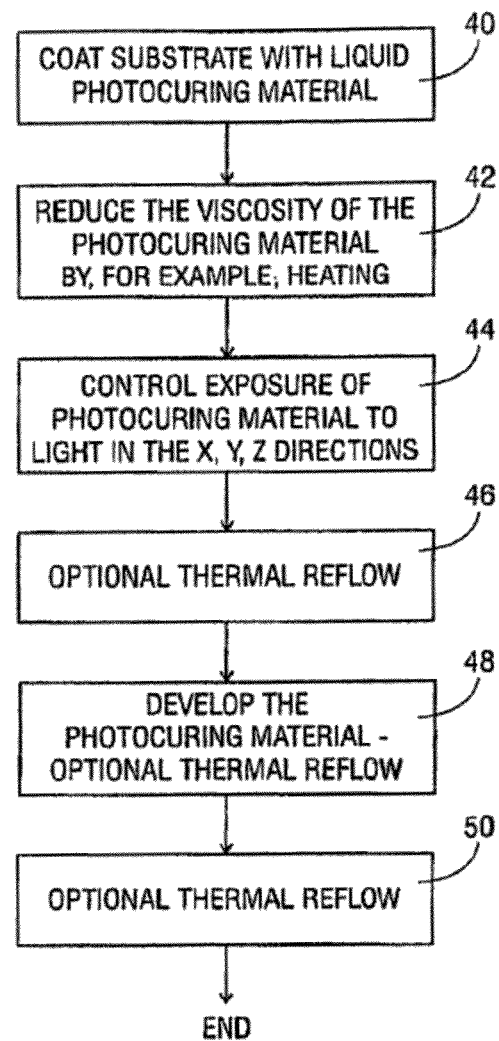

FIG. 7 is a block diagram illustrating the steps performed in carrying out an embodiment of the process disclosed herein. In step 40, a substrate is coated with a photocuring material. (See FIG. 2A). The photocuring material is typically applied to the substrate in liquid form and spun to provide a uniform coating. In step 42, the coating is made less viscous, typically by baking (heating). However, depending on the photocuring material being used, this step may be eliminated. Typically, the final shift to a solid state is accomplished by the application of light at step 44.

The next step 44 is to control the application of light to the photocuring material. (See FIG. 2A) The control can take many forms as discussed above in conjunction with FIG. 6, e.g. controlling one or more of the intensity, the frequency, the in-plan profile and the out of plane profile depending on the structure to be fabricated. Step 44 may be referred to as activating the photocuring material.

Step 46 represents an optional thermal reflow step. The structures created by selective activation of the photocuring material may be heated in step 46 through any appropriate means to achieve a thermal reflow of the material. At step 48 the photocuring material is developed. In some systems, the photocuring material that has been exposed to the light is not removed in the developing step while photocuring material that has not been exposed to the light is removed. In other systems, the opposite occurs. In any event, by controlling the developing time as well as the developing temperature, the ability to influence the shape of the structure through thermal reflow may be achieved at the same time that developing occurs.

Another optional thermal reflow step 50 may be applied. Like the other thermal reflow steps, the application of heat in any suitable manner may be used to shape of the structure by causing certain of the material to reflow as a result of the applied heat.

Developing simplified systems for the creation of more complex structures will create greater utility for researchers in many fields. This simplicity will also allow additional technologies to be implemented in combination with our method. We have demonstrated a three-dimensional process using laser confocal and inverted epifluorescence microscopes, which relies on simple optical methods combined with photoactivatable materials. We can fabricate microstructures with various profiles and heights through control of the heat distribution or the focus for light activation. Through this technology, a wide range of applications will benefit including optical techniques and technologies such as microfluidics and lab-on-a-chip as well as biologically inspired structures.

It should be recognized that the above-described embodiments of the invention are intended to be illustrative only. Numerous alternative embodiments may be devised by those skilled in the art without departing from the scope of the following claims.

It is claimed:

1. A method of optical fabrication, comprising:
    coating a substrate with a photocuring material;
    controlling the application of light to the photocuring material so as to simultaneously control the intensity and pattern of the light both in-plane and out of plane by moving a stage or a lens in an X direction, a Y direction, and a Z direction, wherein the intensity and pattern of the light are applied using a first light beam and a second light beam, wherein the first light beam and the second light beam are applied at a point to positively or negatively interfere to apply the intensity and pattern of the light;
    heating certain structures to cause thermal reflow; and
    developing the photocuring material.

2. The method of claim 1 wherein said photocuring material is an epoxy-type, near-UV photoresist.

3. The method of claim 1 wherein said controlling the application of light in-plane comprises controlling the application of light in an X direction and in a Y direction.

4. The method of claim 1 wherein said controlling the application of light out of plane comprises controlling the application of light in a Z direction.

5. The method of claim 1 additionally comprising controlling the wavelength of the light.

6. The method of claim 1 wherein said controlling the application of light includes controlling a stage and an objective of an epiflourescence microscope or a laser confocal microscope.

7. The method of claim 1, wherein said light is applied using a maskless fabrication technique.

8. The method of claim 1, wherein the X direction, the Y direction, and the Z direction are orthogonal directions.

9. A method of optical fabrication, comprising:
    coating a substrate with a photocuring material;
    heating the photocuring material;
    controlling the application of light to the photocuring material so as to simultaneously control the intensity and pattern of the light in each of an X, a Y, and a Z direction to form structures by moving a stage or a lens in an X direction, a Y direction, and a Z direction, wherein the intensity and pattern of the light are applied using a first light beam and a second light beam, wherein the first light beam and the second light beam are applied at a point to positively or negatively interfere to apply the intensity and pattern of the light;
    heating certain structures to cause thermal reflow; and
    developing the photocuring material.

10. The method of claim 9 wherein said heating certain structures is performed at least one of before or during said developing.

11. The method of claim 9 wherein said photocuring material is an epoxy-type, near-UV photoresist.

12. The method of claim 9 wherein said controlling the application of light in the X and Y directions controls a top profile of fabricated structures.

13. The method of claim 9 wherein said controlling the application of light in the Z direction controls a profile of the walls of the fabricated structures.

14. The method of claim 9 additionally comprising controlling the wavelength of the light.

15. The method of claim 9 wherein said controlling the application of light includes controlling a stage and an objective of an epiflourescence microscope or a laser confocal microscope.

16. The method of claim 9 wherein said heating certain structures is performed after said developing.

17. A method of optical fabrication, comprising:
   coating a substrate with a photocuring material;
   reducing the viscosity of the photocuring material;
   activating a desired pattern within said photocuring material by simultaneously controlling the application of light in each of an X, a Y, and a Z direction by moving a stage or a lens in an X direction, a Y direction, and a Z direction, wherein the intensity and pattern of the light are applied using a first light beam and a second light beam, wherein the first light beam and the second light beam are applied at a point to positively or negatively interfere to apply the intensity and pattern of the light;
   heating a portion of said desired pattern to cause thermal reflow of said photocuring material; and
   developing the photocuring material.

18. The method of claim 17 wherein said controlling the application of light includes controlling a stage and an objective of an epiflourescence microscope.

19. The method of claim 17 wherein said reducing the viscosity includes heating said photocuring material.

20. The method of claim 17 additionally wherein said heating to cause thermal reflow is performed at least one of before or during said developing.

21. The method of claim 20 additionally wherein heating to cause thermal reflow is performed a second time after said developing.

* * * * *